(12) United States Patent
Barr

(10) Patent No.: US 8,847,797 B1
(45) Date of Patent: Sep. 30, 2014

(54) BYTE-ALIGNED DICTIONARY-BASED COMPRESSION AND DECOMPRESSION

(75) Inventor: David Michael Barr, Blacktown (AU)

(73) Assignee: Google Inc., Mountain View, CA (US)

( * ) Notice: Subject to any disclaimer, the term of this patent is extended or adjusted under 35 U.S.C. 154(b) by 205 days.

(21) Appl. No.: 13/485,649

(22) Filed: May 31, 2012

(51) Int. Cl.
*H03M 1/12* (2006.01)

(52) U.S. Cl.
USPC .................................. 341/55; 341/51

(58) Field of Classification Search
CPC ........ H03M 7/30; H03M 7/60; H03M 7/6058
USPC .................................. 341/50, 51, 55
See application file for complete search history.

(56) References Cited

U.S. PATENT DOCUMENTS

| | | | |
|---|---|---|---|
| 6,532,121 B1 * | 3/2003 | Rust et al. ........................ | 360/8 |
| 8,463,944 B2 * | 6/2013 | Bansal et al. .................. | 709/248 |
| 8,615,500 B1 * | 12/2013 | Armangau et al. ........... | 707/693 |
| 2006/0294125 A1 * | 12/2006 | Deaven ........................ | 707/101 |

OTHER PUBLICATIONS

Group Varint, "Information Retrieval Implementing and Evaluating Search Engines," 3 pages, <http://www.ir.uwaterloo.ca/book/addenda-06-index-compression.html>.
Dean, Jeff, "Challenges in Building Large-Scale Information Retrieval Systems," 77 pages.

* cited by examiner

*Primary Examiner* — Brian Young
(74) *Attorney, Agent, or Firm* — Lowenstein Sandler LLP

(57) ABSTRACT

A system reads a metadata byte in a compressed data fragment. The metadata byte includes information pertaining to a sequence of instruction sets to decode data in the compressed data fragment. The sequence of instruction sets follows the metadata byte and one or more literal data sets corresponding to the sequence of instruction sets follows the sequence of instruction sets. The system determines a location of the one or more literal data sets in the compressed data fragment using the metadata byte prior to reading the sequence of instruction sets. The system determines the lengths of the one or more literal data sets based on the sequence of instruction sets and copies the one or more literal data sets, as a batch job for the sequence of instruction sets, to an in-memory data store based on the location and using the lengths.

25 Claims, 12 Drawing Sheets

| Type Code | Data Type | Instruction Length |
|---|---|---|
| 00 | Literal | Short (1 byte) |
| 01 | Literal | Long (2 bytes) |
| 10 | Dictionary | Short (2 bytes) |
| 11 | Dictionary | Long (3 bytes) |

FIG. 5

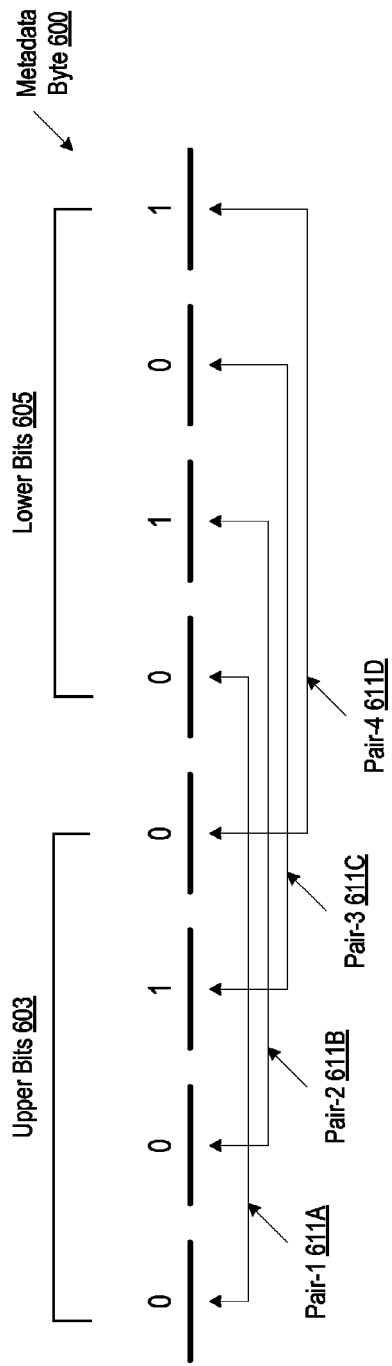
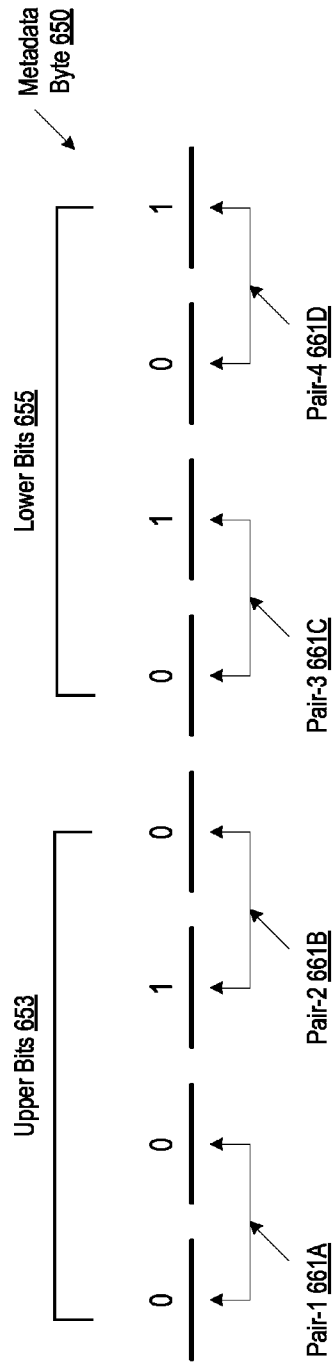

| Metadata Byte Value | Byte Length |
|---|---|
| 0000 0000 | 4 bytes |
| 0000 0001 | 5 bytes |
| 0000 0010 | 5 bytes |
| 0000 0100 | 5 bytes |
| 0000 1000 | 5 bytes |
| 0001 0000 | 5 bytes |
| 0010 0000 | 5 bytes |
| 0100 0000 | 5 bytes |
| 1000 0000 | 5 bytes |
| 0000 0011 | 6 bytes |
| 0000 0111 | 7 bytes |
| 0000 1111 | 8 bytes |
| 0001 1111 | 9 bytes |
| ... | ... |
| 1111 1111 | 12 bytes |

FIG. 9

BYTE-ALIGNED DICTIONARY-BASED COMPRESSION AND DECOMPRESSION

TECHNICAL FIELD

Embodiments of the present disclosure relate to data compression and decompression and, more particularly, to a technique of byte-aligned dictionary-based compression and decompression of data.

BACKGROUND

At times, data may be stored in in-memory data structures, such as a buffer, for fast access as opposed to accessing data directly from disk. In-memory data structures, however, may have limited capacity. Data compression may help maximize the capacity of an in-memory data structure by encoding the data using fewer bits than the original data representation. For example, an original data representation may occupy 500 bytes of an in-memory data structure and data compression techniques can encode the original data representation to create a compressed data representation that may occupy 450 bytes of the in-memory data structure.

Some traditional general purpose data compression/decompression solutions are dictionary-based systems that use a dictionary, for example, of strings of characters, to efficiently encode data. For example, the string "the" may frequently recur in a text document that is being encoded and a conventional compression solution may use an entry for "the" in a dictionary to encode the text document to create a compressed data representation. When decompressing the compressed data representation, conventional decompression solutions may use instructions in the compressed data representation to copy the string "the" from the dictionary to an output buffer to reconstruct the content of the text document.

The instructions in a compressed data representation describe the data that is to be copied to decompress the compressed data representation. Traditional solutions may interleave instructions with the data to be copied in the compressed data representation. For example, a compressed data representation may interleave instructions with data as follows: an instruction, data to be copied, an instruction, data to be copied, etc. Typical decompression solutions may not efficiently decode such a compressed data representation that interleaves one instruction with one set of data because repeatedly switching from reading instructions, to locating data to be copied, and to copying the data to an output buffer may increase processing time. Typical decompression solutions may also increase the processing time because they involve reading entire instructions before locating the data to be copied.

Some conventional compression/decompression solutions use a static dictionary that is made of integer values to compress/decompress integer data. Such solutions are limited to copying data from a dictionary and typically do not support compression/decompression of any data that does not reside in the dictionary.

SUMMARY

In one embodiment, a computing device reads a metadata byte in a compressed data fragment. The metadata byte includes information pertaining to a sequence of instruction sets to decode data in the compressed data fragment. The sequence of instruction sets follows the metadata byte. One or more literal data sets that correspond to the sequence of instruction sets follow the sequence of instruction sets. The computing device determines a location of the one or more literal data sets in the compressed data fragment using the metadata byte prior to reading the sequence of instruction sets and determines a length of each of the one or more literal data sets based on the sequence of instruction sets. The computing device copies the one or more literal data sets to an in-memory data store, as a batch job for the sequence of instruction sets, based on the location and a corresponding length.

In one embodiment, the computing device determines a length of at least one set of dictionary data to be copied from the sequence of instruction sets and copies the at least one set of dictionary data to the in-memory data store as part of the batch job using the corresponding length. In one embodiment, the sequence of instruction bytes comprises four instruction bytes. In one embodiment, a metadata byte includes one bit for each of the sequence of instruction sets to indicate whether a corresponding instruction sets pertains to literal data or dictionary data and one bit for each of the sequence of instruction sets to indicate whether a corresponding instruction sets pertains to short data or long data. In one embodiment, the short data for literal data is one byte and long data for literal data is two bytes, and short data for dictionary data is two bytes and long data for dictionary data is three bytes.

In one embodiment, an instruction set includes no more than two bytes describing a length of a corresponding literal data set or no more than two bytes describing an offset in a dictionary and one byte describing a length of dictionary data to be copied.

In one embodiment, the computing device determines the location of the one or more literal data sets by determining a number of populated bits in the metadata byte and determining a sum of the number of populated bits added to four, wherein the sum represents a number of bytes following the metadata byte and immediately preceding the location of the one or more literal data sets. In one embodiment, the computing device determines the location of the one or more literal data sets by creating mapping data that correlates available values for the metadata byte to a number of bytes and locating an available value in the mapping data that matches an actual value of the metadata byte. The number of bytes that corresponds to the matching available value represents a number of bytes following the metadata byte corresponding to the location of the one or more literal data sets.

In one embodiment, the computing device creates a metadata byte comprising information pertaining to a sequence of instruction sets to decode data in a compressed data fragment. The metadata byte provides a starting location of one or more literal data set that correspond to at least one of the sequence of instruction sets, The computing device concatenates the sequence of instruction sets with the metadata byte. The least one of the instruction sets comprises at least one byte describing a length of the literal data that corresponds to the at least one instruction set. The computing device concatenates the one or more literal data sets with the concatenation of the sequence of instruction sets and the metadata byte.

In additional embodiments, methods for performing the operations of the above described embodiments are also implemented. Additionally, in embodiments of the present disclosure, a non-transitory computer readable storage medium stores methods for performing the operations of the above described embodiments.

BRIEF DESCRIPTION OF THE DRAWINGS

Various embodiments of the present disclosure will be understood more fully from the detailed description given below and from the accompanying drawings of various embodiments of the disclosure.

FIG. 5 illustrates exemplary type codes, in accordance with some embodiments.

FIGS. 6A-B illustrate exemplary metadata bytes, in accordance with some embodiments.

FIG. 9 illustrates exemplary mapping data, in accordance with some embodiments.

DETAILED DESCRIPTION

Figure 1:
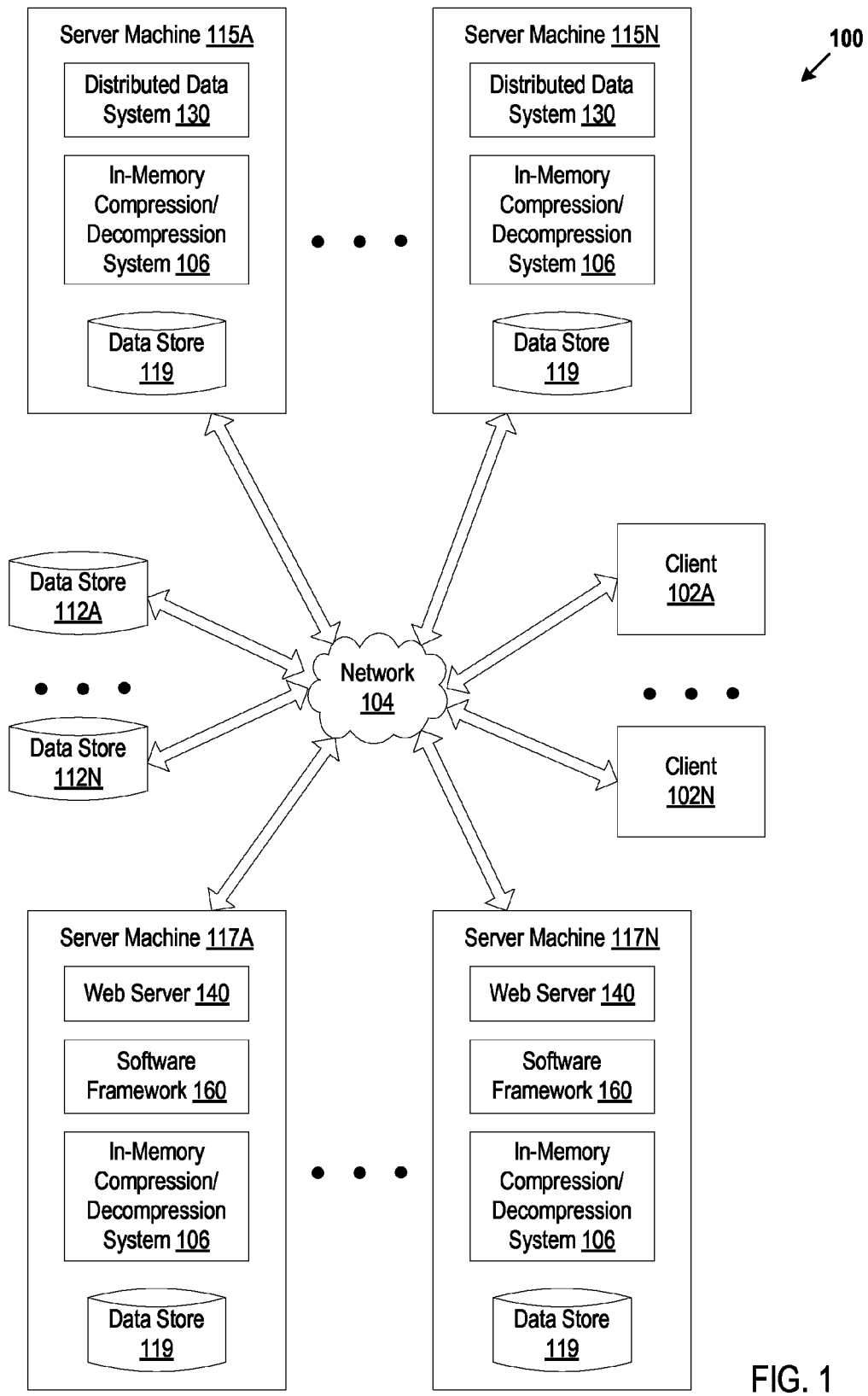
FIG. 1 illustrates exemplary system architecture, in accordance with various embodiments of the present disclosure.

A system and method for in-memory byte-aligned dictionary-based compression and decompression of an input data stream. An input data stream can be encoded into one or more compressed data fragments. A compressed data fragment includes one or more groups of compression-related information. Each group of compression-related information includes a metadata byte followed (e.g., immediately followed) by a sequence of instruction sets (e.g., four instructions sets). The sequence of instruction sets may be followed (e.g., immediately followed) by one or more sets of literal data that correspond to the sequence of instruction sets.

The metadata byte indicates whether a corresponding sequence of instruction sets (e.g., four instruction sets) describes literal data that is to be copied from a corresponding literal data set or dictionary data that is to be copied from a dictionary.

In one embodiment, the system decodes a compressed data fragment by reading a metadata byte and determining a location of corresponding literal data sets in the compressed data fragment using the metadata byte prior to reading the sequence of instruction sets. The system can speed up the time it takes to decompress the compressed data fragment by determining the location of the literal data sets without having to read each instruction set in the sequence of instruction sets (e.g., four instruction sets). For example, the system may determine from the metadata byte that the literal data sets begin immediately after five bytes from the location of the end of the metadata byte in the compressed data fragment.

Each instruction set in the sequence of instruction sets (e.g., four instruction sets) may include at least one byte of data for an integer value representing the length of data that is to be copied. For example, the integer value in the first instruction set may indicate that 68 bytes of data in a corresponding literal data set is to be copied, the integer value in the second instruction set may indicate that 129 bytes of dictionary data in a dictionary is to be copied, the integer value in the third instruction set may indicate that 26 bytes of data in a corresponding literal data set is to be copied, and the integer value in the fourth instruction set may indicate that 12 bytes of data in a corresponding literal data set is to be copied. The system utilized by the embodiments of the present disclosure may be a dictionary-based system where a dictionary is used to represent a string of characters that recurs in the compressed data fragment. For example, the string "and" recurs in the compressed data fragment and the system can compress the string "and" and decompress the string "and" using a dictionary entry for the string "and."

The system may further be a byte-aligned system where data is being copied with reference to bytes. Byte-aligned data can be quick to access since there is likely to be less ambiguity of where data representation ends and begins with the use of byte boundaries. Whereas, in bit-aligned systems, there may be ambiguity as to where the data representation ends and begins since an integer representation may occupy any number of bits.

In some embodiments, the system copies the literal data sets, as a batch job for the sequence of instruction sets, to an in-memory data structure (e.g., an output buffer) based on the location and using the corresponding length. The system can repeat these operations for each group of compression-related information in the compressed data fragment to create a decompressed data fragment in the output buffer.

Embodiments can reduce the amount of time it takes to decompress the compressed data fragment by copying the data for the sequence of instruction sets (e.g., four instructions sets) for each group as a batch job and by determining the location of the literal data sets without having to read each of the sequence of instruction sets (e.g., four instruction sets).

FIG. 1 illustrates exemplary system architecture 100 in which embodiments can be implemented. The system architecture 100 includes a number of server machines 115A-115N, 117A-117N, a number of data stores 112A-112N, and a number of client machines 102A-102N connected to a network 104. Network 104 may be a public network (e.g., the Internet), a private network (e.g., a local area network (LAN) or wide area network (WAN)), or a combination thereof.

Server machine 115A-115N, 117A-117N may be a rack-mount server, a router computer, a personal computer, a portable digital assistant, a mobile phone, a laptop computer, a tablet computer, a camera, a video camera, a netbook, a desktop computer, a media center, or any combination of the above. A number of server machines 115A-115N may be clustered and coupled to a number of data stores 112A-112N to form a distributed data store, such as a distributed file system. A distributed file system allows access to data from multiple machines via the network 104. The server machines 115A-115N can host a distributed data system 130 to form, for example, a distributed database. The distributed database can be based on the distributed file system built from the data stores 112A-112N. A data store 112A-112N is a persistent storage that is capable of storing data. As will be appreciated by those skilled in the art, in some embodiments data store 112A-112N might be a network-attached file server, while in other embodiments data store 112A-112N might be some other type of persistent storage such as an object-oriented database, a relational database, and so forth.

Examples of the data stored in the data stores 112A-112N can include, and are not limited to, web data, company data, user data, data uploaded by users via client machines 102A-102N, etc. The client machines 102A-102N may be personal computers (PC), laptops, mobile phones, tablet computers, or any other computing devices. The client machines 102A-102N may run an operating system (OS) that manages hardware and software of the client machines 102A-102N. A browser (not shown) may run on the client machines (e.g., on the OS of the client machines). The browser may be a web browser that can access content served by a web server.

A number of server machines 117A-117N can include a software framework 160 and/or a web server 140 to access data that is managed by the distributed data system 130 and the data in the data stores 112A-112N. In alternative embodiments, a software framework 160 and web server 140 may run on different machines. A software framework 160 provides software functionality which can be selectively changed by user code to provide application specific software. Software framework 160 can be a distributed data software framework to support distributed computing on large data sets, such as the data stored in data stores 112A-N. Software framework 160 can enable applications, such as applications running via a web server 140, to work with the data in the data stores 112A-112N.

The data or a portion of the data in the data stores 112A-112N can also be stored in one or more in-memory data stores (also referred to as in-memory data structures) 119 for fast access. Accessing data in an in-memory data store 119 reduces the I/O reading activity when querying the data. An in-memory data store 119 can reside in volatile memory (e.g., in the form of a buffer) on a server machine 115A-115N, 117A-117N. A buffer is a region of a physical memory storage used to temporarily hold data. A server machine 115A-115N, 117A-117N can include more than one buffer. In one embodiment, server machine 115A-115N, 117A-117N notifies users of the types of information that are stored in data stores 112A-112N and/or data stores 119 and provides the user the opportunity to opt-out of having such information collected and/or shared with the distributed data system 130 and/or other components hosted by server machine 115A-115N, 117A-117N.

The data in the in-memory data store 119 is hereinafter referred to as an input data stream. For brevity and simplicity, strings of alphanumeric characters are used as examples of data stored in an in-memory data store 119 throughout this document. The storage capacity of the in-memory data store 119 may be limited. Server machines 115A-115N, 117A-117N can include an in-memory compression/decompression system 106 to compress the input data stream to make maximum use of the in-memory data store 119. In alternative embodiments, the distributed data system 130 and in-memory compression/decompression system 106 may run on different machines. The in-memory compression/decompression system 106 can encode the input data stream to use fewer bits than the original data representation would use. For example, the input data stream may contain content of a web page with strings of alphanumeric characters that occupy 330 bytes of the in-memory data store 119. The in-memory compression/decompression system 106 can compress the strings of alphanumeric characters from 330 bytes to 311 bytes.

The in-memory compression/decompression system 106 can compress the input data stream by identifying recurring patterns in the input data stream and creating a dictionary based on the content of the input data stream. For example, the string "and" may be a recurring pattern in the input data stream and the in-memory compression/decompression system 106 may create an entry in a dictionary for the string "and" to compress the data. One embodiment of compressing data using recurring patterns is described in greater detail below in conjunction with FIG. 3. When the in-memory compression/decompression system 106 decodes a compressed data fragment, the in-memory compression/decompression system 106 can use the entry in the dictionary for the string "and" to decompress the data.

Literal data is data that does not match data in a dictionary. Dictionary data is data that can be referenced to entries in a dictionary. When the in-memory compression/decompression system 106 is encoding an input data stream, the in-memory compression/decompression system 106 can read a portion of the input data stream and determine whether there is matching data in the dictionary. When there is a match in the dictionary, the in-memory compression/decompression system 106 can create an instruction set that describes the location in the dictionary of the matching data and the length of the matching data. When there is not a match in the dictionary, the in-memory compression/decompression system 106 can create a literal data set that includes the portion of the input data stream and can create an instruction set that indicates the length of the literal data set. The in-memory compression/decompression system 106 can also create an entry in the dictionary for the portion of the input data stream.

For example, the input data stream may include the following fragment: "can count countville count the countably infinite count." When the in-memory compression/decompression system 106 is encoding the characters "count" for the first time, the in-memory compression/decompression system 106 can identify the characters as being literal data because there is not a match in a dictionary. The in-memory compression/decompression system 106 can create a literal data set that includes the characters "count" and an instruction set describing the length of the literal data set. The in-memory compression/decompression system 106 can add the characters "count" to the dictionary. Subsequently, when the characters "countville" in the input data stream are encoded, the in-memory compression/decompression system 106 can determine that the characters "count" in "countville" match "count" in the dictionary and can create an instruction set that indicates the location of "count" in the dictionary and the length of the "count" in the dictionary. The in-memory compression/decompression system 106 may then identify that the characters "ville" in "countville" are literal data because there is no match in the dictionary.

The instruction sets are used to decompress the data. The instruction sets can describe how much of the data (e.g., length of the data) is to be copied from a literal data set in the compressed data fragment and/or data from a dictionary to an output buffer. An instruction set can include one or two bytes containing bits that describe the length of the data to be copied.

The in-memory compression/decompression system 106 can create any number of instructions sets for an input data stream. A compressed input data stream may include multiple compressed data fragments, and the in-memory compression/decompression system 106 can include one or more groups of compression-related information. Each group of compression-related information includes a metadata byte followed by a sequence of instruction sets, which may be in turn followed by one or more sets of literal data that correspond to the sequence of instruction sets. The in-memory compression/decompression system 106 can create metadata byte for each sequence of instruction sets. The metadata byte describes a corresponding sequence of instruction sets (e.g., four instruction sets). The metadata byte describes whether each instruction set in a corresponding sequence is for copying literal data to an output buffer or for copying dictionary data to an output buffer.

Figure 2:
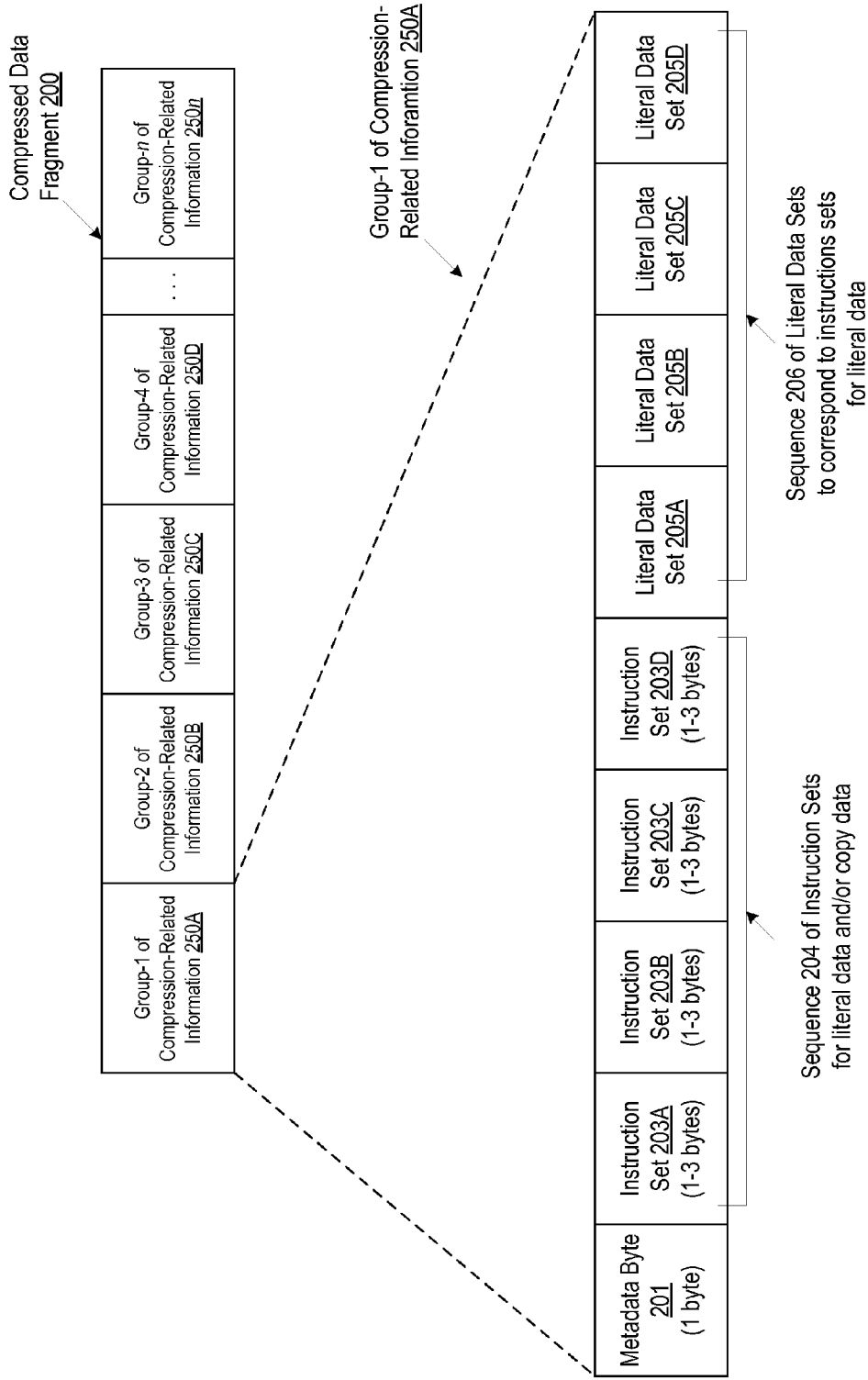
FIG. 2 is a block diagram of exemplary groups of compression-related information in a compressed data fragment, in accordance with some embodiments.

FIG. 2 is a block diagram of exemplary groups of compression-related information in a compressed data fragment 200, according to some embodiments. Each group 250A-n can include a sequence 204 of instruction sets followed (e.g., immediately followed) by a corresponding sequence 206 of literal data sets. When an instruction set 203A-D is for literal data, there is a corresponding literal data set 205A-B in the sequence of instruction sets 250A. In one embodiment, a sequence 204 of instruction sets includes four instruction sets and a sequence 206 of literal data sets includes up to four literal data sets. For example, two instruction sets 203A,B may describe literal data and two instructions sets 203C,D may describe copy data. There are two literal data sets 205A,B that correspond to the two instruction sets 203A,B that describe literal data.

Each group 250A-n includes a metadata byte 201 preceding the corresponding sequence 204 of instruction sets. A metadata byte 201 contains information describing a corresponding sequence 204 of instruction sets 203A-D. A metadata byte 201 can include bits that describe the length of the corresponding sequence 204 of instruction sets. One advantage of including the length of the instruction sets in the metadata byte 201 is that the decoder can quickly determine the location of where the literal data sets 205A for the group 250 begins without having to read the instruction sets 203A. One embodiment of determining the location of the literal data sets using a metadata byte is described in greater detail below in conjunction with FIGS. 7-9.

Returning to FIG. 1, the in-memory compression/decompression system 106 can decompress a compressed data fragment by decoding the groups of compression-related information one-by-one to form a decompressed data fragment. Decompression can include copying data from a literal data set in the compressed data fragment and copying data from a dictionary to an output buffer (e.g., data store 119) to reconstruct the original data representation in a decompressed data fragment. When decoding each group of compression-related information, the in-memory compression/decompression system 106 can speed up the time it takes to decode the data for the group by using the metadata byte for the group to determine the location of the literal data to be copied and by copying the literal data for the group as a batch job to an output buffer. The in-memory compression/decompression system 106 can repeat the decompression to decode data for each group of compression-related information to create a decompressed data fragment in the output buffer.

Figure 3:
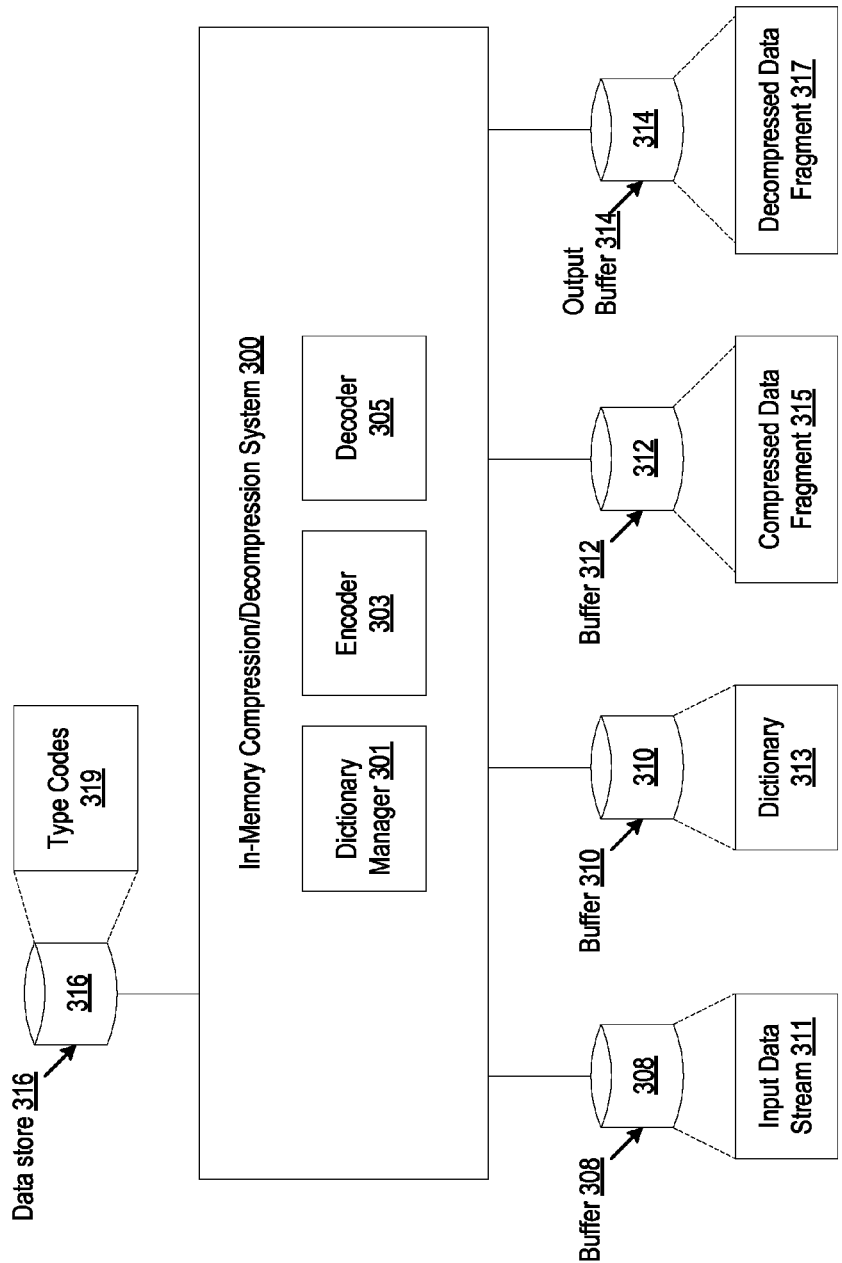
FIG. 3 is a block diagram of an in-memory compression/decompression system, in accordance with an embodiment.

FIG. 3 is a block diagram of an in-memory compression/decompression system 300, in accordance with one embodiment of the present disclosure. The in-memory compression/decompression system 300 includes a dictionary manager 301, an encoder 303, and a decoder 305. Note that in alternative embodiments, the functionality of one or more of the dictionary manager 301, the encoder 303, and the decoder 305 may be combined or divided.

The in-memory compression/decompression system 300 can be coupled to one or more in-memory buffers 308,310, 312,314. In one embodiment, the buffers 308,310,312,314 are separate buffers. Alternatively, two or more of the buffers 308,310,312,314 can be combined into the same buffer. Buffers 308,310,312,314 can be implemented in a fixed memory location in hardware or by using a virtual data buffer in software, pointing at a location in the physical memory. In one embodiment, a buffer 308,310,312,314 is a region of RAM (Read Access Memory) to store temporary data.

The in-memory compression/decompression system 300 can be coupled to a look-ahead buffer 308 that stores an input data stream 311 to be encoded to create a compressed data fragment 315. The input data stream 311 can include strings of alphanumeric characters.

The dictionary manager 301 can create a dictionary 313 to be used for encoding data in an input data stream 311 and decoding data in a compressed data fragment 315. The dictionary manager 301 can create entries in the dictionary 313 to represent groups of characters (e.g., "the," "count," etc.) from the input data stream 311 as the encoder 303 encodes the input data stream 311. The dictionary 313 can include a single copy of a particular group of characters. The dictionary 313 can be stored in the buffer 310.

The encoder 303 can read portions of the input data stream 311 and create instruction sets for literal data and/or instruction sets for dictionary data for the corresponding portion. The encoder 303 can use an encoding scheme that is byte-oriented, where a portion of the input data stream 311 is read in terms of whole bytes. An instruction set for literal data can include bytes indicating the length of a literal data set that is to be copied. An instruction set for dictionary data can include bytes indicating an offset in the dictionary of the location of the dictionary data to be copied and the length of the dictionary data to be copied. An instruction set for literal data is hereinafter referred to as a literal instruction set. An instruction set for dictionary data is hereinafter referred to as a dictionary instruction set.

Figure 4:
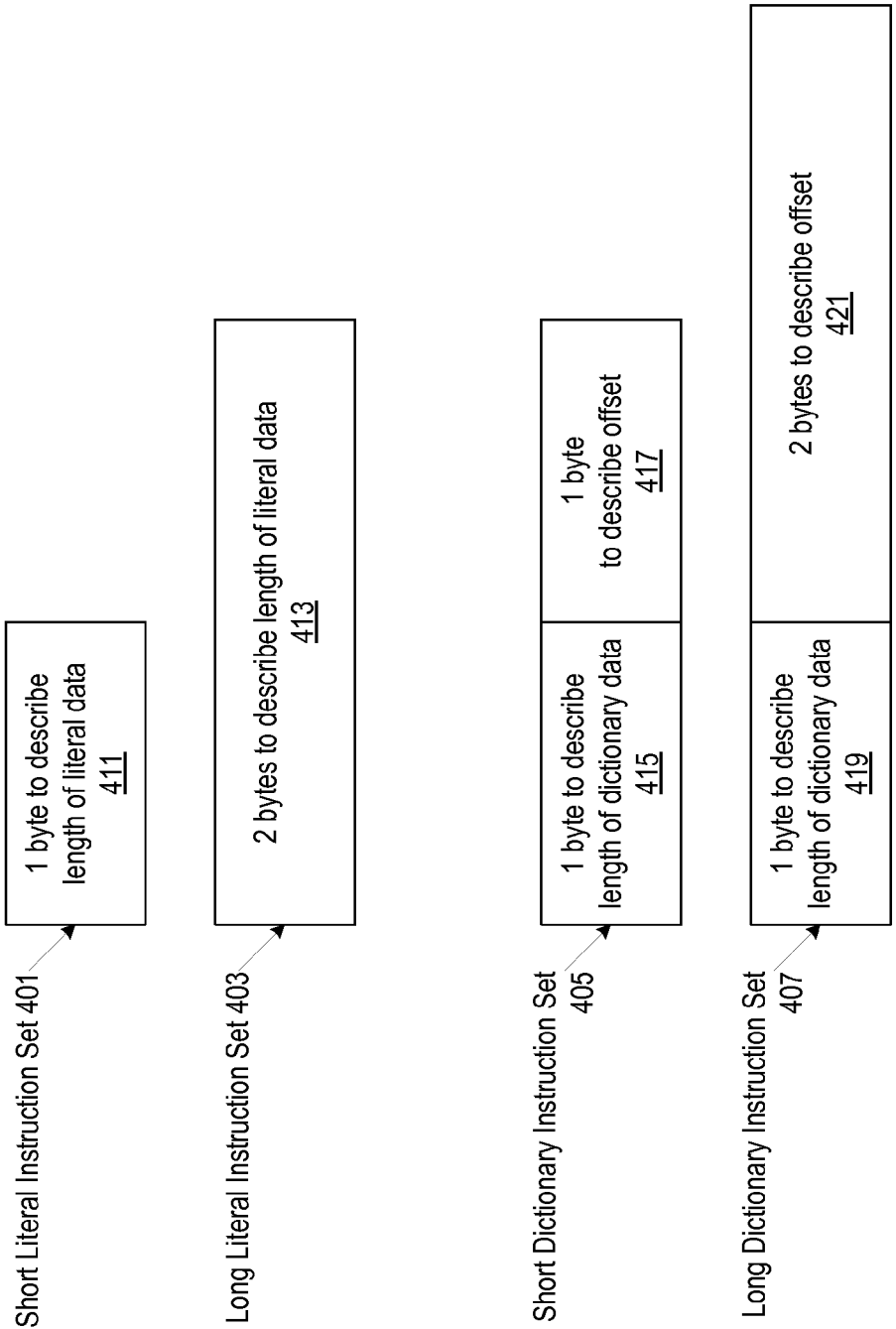
FIG. 4 illustrates exemplary formats of instruction sets, in accordance with some embodiments.

FIG. 4 illustrates exemplary formats of instruction sets according to some embodiments. For example, the formats 401,403,405,407 may describe instructions sets 203A-D in FIG. 2. The bytes 411,413 in a literal instruction set 401,403 describe the length of the data in the corresponding literal data set (e.g., literal data sets 205A-D in FIG. 2) that is to be copied. In one embodiment, a short literal instruction set 401 includes one byte to form an 8-bit integer using little-endian encoding and a long literal instruction set 403 includes two bytes to form a 16-bit integer using little-endian encoding. In one embodiment, a literal instruction set 401,403 includes no more than two bytes.

In one embodiment, the first byte 415,419 in a dictionary instruction set 405,407 describes the length of the data in the dictionary that is to be copied. In one embodiment, a dictionary instruction set 405,407 includes one byte to describe an integer for the length of the data to be copied. In one embodiment, a dictionary instruction set 405,407 includes no more than two bytes to describe an integer for the length of the data to be copied.

In one embodiment, the additional bytes 417,421 in a dictionary instruction set 405,407 that follow the first byte 415, 419 describe the offset to use to identify where the data to be copied is located in the dictionary. For example, a short dictionary instruction set 405 includes an additional one byte 415 to describe the offset and a long dictionary instruction set 407 includes an additional two bytes 421 to describe the offset. In one embodiment, a dictionary instruction set 405, 407 includes one byte to describe an integer for the offset value. In one embodiment, a dictionary instruction set 405, 407 includes no more than two bytes to describe an integer for the offset value. One embodiment of the length and offset of the dictionary data is described in greater detail below in conjunction with FIG. 7.

Returning to FIG. 3, the encoder 303 can store the instruction sets as part of the compressed data fragment 315 in a buffer 312. The encoder 303 can create groups of compression-related information for various sequences of instruction sets and store the groups of compression-related information in the compressed data fragment 315. In one embodiment, a group of compression-related information includes a sequence of four instruction sets. For each sequence of instruction sets, the encoder 303 can create a metadata byte that describes a corresponding sequence of instruction sets and can include the metadata byte in a corresponding group of compression-related information. The encoder 303 can use a pre-defined set of type codes 319 stored in a data store 316 that is coupled to the encoder 303 to create a metadata byte. The data store 316 can be a persistent storage unit. The encoder 303 can use the type codes 319 to populate the values in the metadata type. The type codes 319 describe whether the corresponding instruction set is for literal data or copy data and whether the instruction set has a short length or a long length.

The type codes 319 can be stored in a table. FIG. 5 illustrates an exemplary table 500 of exemplary type codes, in accordance with some embodiments. Type code '00' (501) describes a short literal instruction set (e.g., 1 byte). Type code '01' (503) describes a long literal instruction set (e.g., 2 bytes). Type code '10' (505) describes a short dictionary instruction set (e.g., 2 bytes). Type code '11' (507) describes a long dictionary instruction set (e.g., 3 bytes). In one embodiment, the least significant bit (right-most bit) describe whether the instruction set is for literal data or dictionary data. In one embodiment, a "0" bit (also referred to as an unpopulated bit and/or a not enabled bit) describes an instruction set for literal data and a "1" bit (also referred to as a populated bit and/or an enabled bit) describes an instruction set for dictionary data. In another embodiment, a "1" bit describes an instruction set for literal data and a "0" bit describes an instruction set for dictionary data.

In one embodiment, the most significant bit (left-most bit) describes the length of the instruction set. In one embodiment, a "0" bit describes a short length and a "1" bit describes a long length. In another embodiment, a "1" bit describes a short length and a "0" bit describes a short length. In one embodiment, a short literal instruction set is one byte and a long literal instruction set is two bytes. In one embodiment, a short dictionary instruction set is two bytes and a long dictionary instruction set is three bytes.

FIG. 6A illustrates an exemplary metadata byte 600 according to one embodiment. The metadata byte includes four pairs 611A-D of bits. Each pair 611A-D corresponds to an instruction set in the sequence of four instruction sets (e.g., instruction sets 203A-D in FIG. 2) that are immediately following the metadata byte 600. Each pair 611A-D is a type code that describes whether the corresponding instruction set is for literal data or copy data and whether the instruction set is a short instruction or a long instruction. The metadata byte 600 includes upper bits 603 and lower bits 605. A pair 611A-D of bits can include one of the upper bits 603 and one of the lower bits 605, according to one embodiment. Alternatively, a metadata byte can have pairs of bits including two upper bits or two lower bits. One embodiment of a metadata byte 650 having pairs of bits including two upper bits or two lower bits is described in greater detail in conjunction with FIG. 6B. In particular, referring to FIG. 6B, Pair-1 661A and Pair-2 661B in metadata byte 650 each include two upper bits 653. Pair-3 661C and Pair-4 661D in metadata byte 650 each include two lower bits 665. Each pair 661A-D corresponds to an instruction set in the sequence of four instruction sets (e.g., instruction sets 203A-D in FIG. 2) that are immediately following the metadata byte 650.

Returning to FIG. 3, the encoder 303 can create a literal data set for each of the instruction sets that describe literal data. The encoder 303 can concatenate the sequence of instruction sets with a corresponding metadata byte and can concatenate the literal data with the concatenation of the sequence of instruction bytes and the metadata byte to form a group of compression-related information. The encoder 303 can concatenate the groups of compression-related information to form the compressed data fragment 315. The decoder 305 can decode the compressed data fragment 315 stored in the buffer 312 to create a decompressed data fragment 317 in an output buffer 314. The decompressed data fragment 317 represents the input data stream 311 in its original format. The decoder 305 can decode the groups of compression-related information one-by-one to form the decompressed data fragment 317. The decoder 305 can use the metadata bytes in the compressed data fragment 315, the dictionary 313, the type codes 319, the sequence of instructions in each group, and the literal data sets for the sequence of instructions for each the group to create the decompressed data fragment 317.

Figure 7:
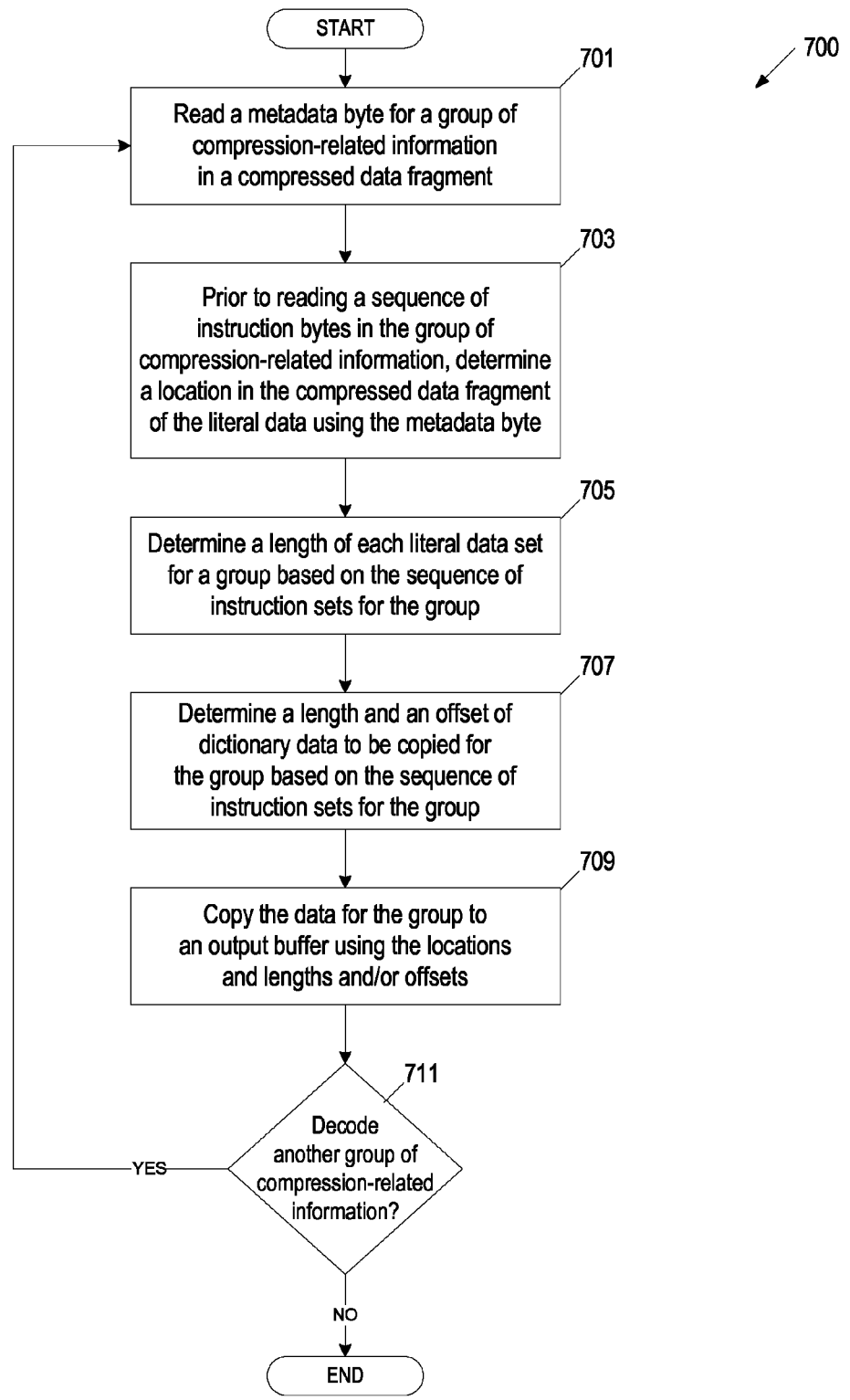
FIG. 7 is a flow diagram of an embodiment of a method for decoding compressed data using a metadata byte describing a corresponding group of compression-related information for each group of compression-related information in the compressed data.

FIG. 7 is a flow diagram of an embodiment of a method 700 for decoding compressed data using a metadata byte describing a corresponding sequence of instructions for each group of compression-related information in the compressed data. The method 700 is performed by processing logic that may comprise hardware (circuitry, dedicated logic, etc.), software (such as is run on a general purpose computer system or a dedicated machine), or a combination of both. In one embodiment, the method 700 is performed by the server machine 115A-N,117A-N of FIG. 1. The method 700 may be performed by an in-memory compression/decompression system 106 running on server machine 115A-N,117A-N or another machine.

At block 701, processing logic reads a metadata byte for a group of compression-related information in a compressed data fragment. The metadata byte includes information pertaining to a sequence of instruction sets that are following (e.g., immediately following) the metadata byte in the compressed data fragment. Each instruction set includes bytes of data that can be used to decode data in the compressed data fragment. The literal data that corresponds to the sequence of instruction sets may immediately follow the sequence of instruction sets.

At block 703, prior to reading the sequence of instruction sets in the group of compression-related information, processing logic determines a location in the compressed data fragment of the literal data sets using the metadata byte. Using the metadata byte to determine the location of the literal data sets can speed up the decoding process. The metadata byte includes pairs of bits to represent type codes (e.g., 00, 01, 10, 11) that describe whether a corresponding instruction set is for literal data or copy data and whether the corresponding instruction set has a short length or a long length.

Figure 8:
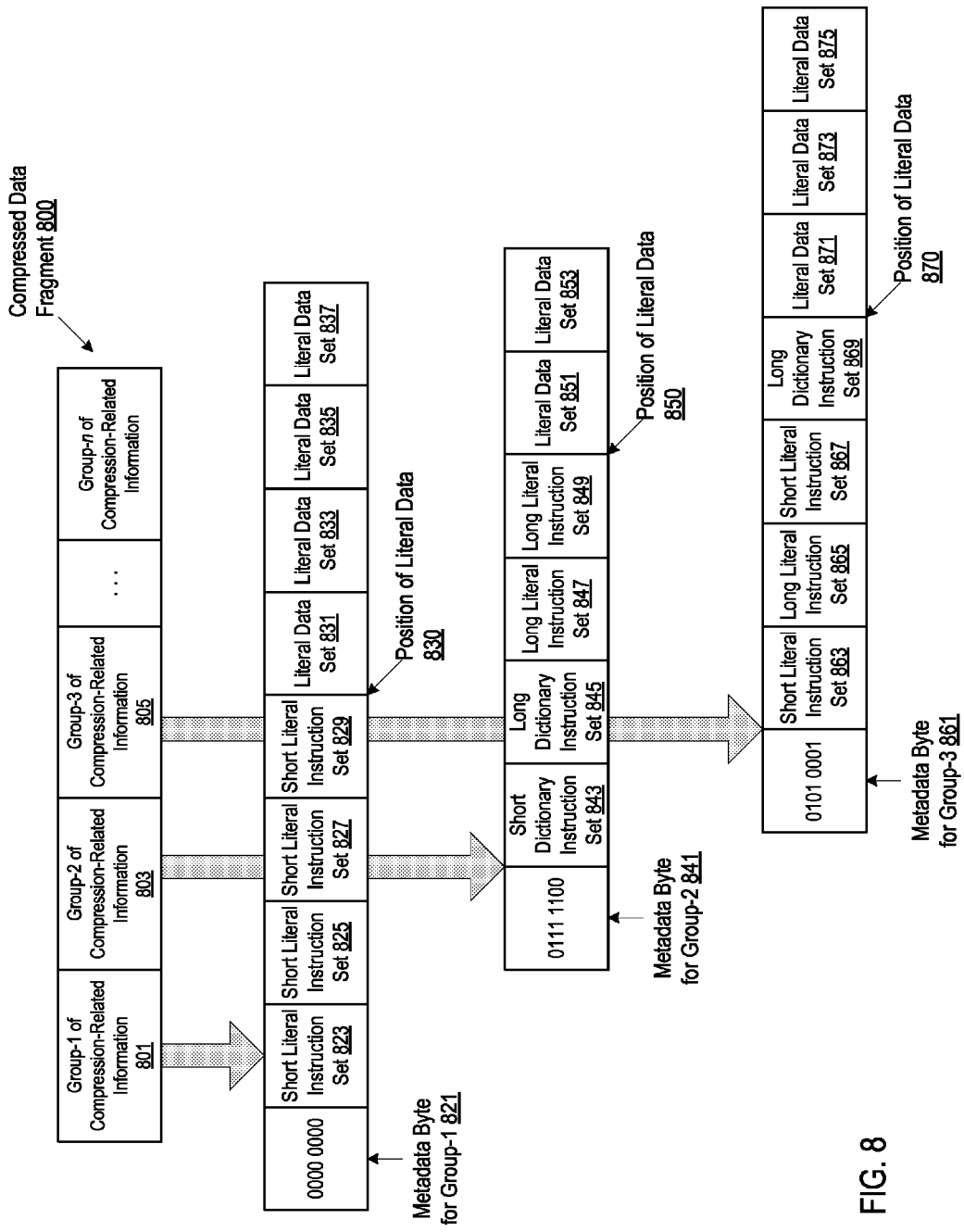
FIG. 8 illustrates exemplary metadata bytes corresponding to groups of compression-related information in a compressed data fragment, in accordance with some embodiments.

In one embodiment, processing logic determines a location in the compressed data fragment of the literal data sets by counting the populated bits (e.g., "1" bits) in the metadata byte. The location of the literal data sets can be described as an offset in terms of a number of bytes following the metadata byte. Processing logic can determine the number of "1" bits in the metadata byte and add 4 to the number of "1" bits to determine the length of the sequence of instructions sets in terms of bytes. The location in the compressed data fragment of the literal data sets for the sequence of instructions in the group of compression-related information can be determined based on the length of the sequence of instruction sets. For example, FIG. 8 illustrates exemplary metadata bytes 821, 841,861 corresponding to groups 801,803,805 of compression-related information in a compressed data fragment 800, according to some embodiments. Group-1 801 includes metadata byte 821 having bits "0000 0000" that describe the corresponding sequence of instruction sets 823,825,827,829. There are four literal data sets 831,833,835,837 that correspond to the four instructions 823,825,827,829 for literal data. The number of "1" bits in the metadata byte 821 can be added to the number 4 to determine the length of the sequence of instruction sets 823,825,827,829. There are no "1" bits in the metadata byte 821 resulting in the length of the instruction sets 823,825,827,829 as "0+4=4 bytes." The instruction sets 823,825,827,829 occupy the four bytes immediately preceding the first literal data set 831. The position 830 of the start of the literal data sets 831,833,835,837 in the Group-1 801 is after the four bytes that are being occupied by the instructions sets 823,825,827,829. For example, the position 830 is the first byte after the four bytes length of the instruction sets 823,825,827,829.

In another example, Group-2 803 includes metadata byte 841 having bits "0111 1100" that describe the corresponding sequence of instruction sets 843,845,847,849. There are two literal data sets 851,853 that correspond to the two instructions 847,849 for literal data. There are five "1" bits in the metadata byte 841 resulting in the length of the instruction sets 843,845,847,849 as "5+4=9 bytes." The position 850 of the start of the literal data 851,853 in the Group-2 803 is immediately following the nine bytes length of the instruction sets 843,845,847,849.

In another example, Group-3 805 includes metadata byte 861 having bits "0101 0001" that describe the corresponding sequence of instruction sets 863,865,867,869. There are three literal data sets 871,873,875 that correspond to the three instructions 863,865,867 for literal data. There are three "1" bits in the metadata byte 861 resulting in the length of the instruction sets 863,865,867,869 as "3+4=7 bytes." The position 870 of the start of the literal data 871,873,875 in the Group-3 805 is immediately after the seven bytes length of the instruction sets 863,865,867,869.

Returning to FIG. 7, at block 703, in another embodiment, processing logic determines a location in the compressed data fragment of the literal data sets within a group of compression-related information using mapping data. In one embodiment, the mapping data is a pre-defined table that includes the actual values for the possible metadata bytes and a corresponding offset in terms of byte length. The mapping data can be stored in a data store that is coupled to the in-memory compression/decompression system. FIG. 9 illustrates exemplary mapping data, according to one embodiment. The mapping data is a table 900 that includes the possible bit values 901 for a metadata byte and the corresponding byte length 903 that describes the byte length of the corresponding instruction sets.

Returning to FIG. 7, at block 705, prior to copying any literal data for the group, processing logic determines a length of each literal data set in the group based on the short literal instruction sets and/or long literal instruction sets for the group. The length is the number of bytes to copy from a corresponding literal data set. Determining the length of the literal data sets for the group before copying any of the literal data for the group can speed up the decompression process. The length of the literal data set can be described as an integer value of bytes. A single byte has 256 values and a short (e.g., 1 byte) literal instruction set can store the integer values 0-255. In one embodiment, a short literal instruction set forms an 8-bit integer using little-endian encoding. A long (e.g., 2 bytes) literal instruction set can store the integer values 0-65535. In one embodiment, a long literal instruction set forms a 16-bit integer using little-endian encoding.

At block 707, prior to copying any dictionary data for the group, processing logic determines a length and an offset of the dictionary data for the group to be copied based on each short dictionary instruction set and/or long dictionary instruction set for the group. The length is the number of bytes to copy from dictionary. Determining the length and offset of the dictionary data for the group before copying any of the dictionary data for the group can speed up the decompression process. In one embodiment, the first byte in a dictionary instruction set describes the length of the data in the dictionary that is to be copied. For example, the first byte may describe a length of 128 bytes to be copied in the dictionary. In one embodiment, a first byte in a dictionary instruction set forms an 8-bit integer using little-endian encoding. In one embodiment, the additional bytes in a dictionary instruction set that follow the first byte describe the offset to use to identify where the data to be copied is located in the dictionary. For example, a short dictionary instruction set includes an additional one byte to describe the offset in the dictionary. For example, the additional one byte may describe an offset of 63 bytes in the dictionary. In one embodiment, the additional one byte in a short dictionary instruction set forms an 8-bit integer using little-endian encoding. In another example, a long dictionary instruction set includes an additional two bytes to describe the offset in the dictionary. For example, the additional two bytes may describe an offset of 58442 bytes in the dictionary. In one embodiment, the additional two bytes in a long dictionary instruction set forms a 16-bit integer using little-endian encoding.

At block 709, processing logic copies the data for the group to an in-memory data store (e.g., an output buffer), as a batch job, based on the locations, lengths, and/or offsets. Processing logic can perform the copying operations together to reduce the processing time. For example, processing logic can perform the copying of the literal data for the group together using the determined locations of the literal data sets and the lengths of the literal data sets. In another example, processing logic can perform the copying of the dictionary data for the group together using the determined locations and offsets of the dictionary data. In another example, processing logic can perform the copying of the dictionary data and the copying of the literal data for the group together using the determined locations and offsets.

At block 711, processing logic determines whether there is another group of compression-related information in the compressed data fragment to decode. If there is another group of compression-related information to decode, processing logic returns to block 701 to read the metadata byte for the next group of compression-related information. If there is not another group of compression-related information to decode, the method ends.

Figure 10:
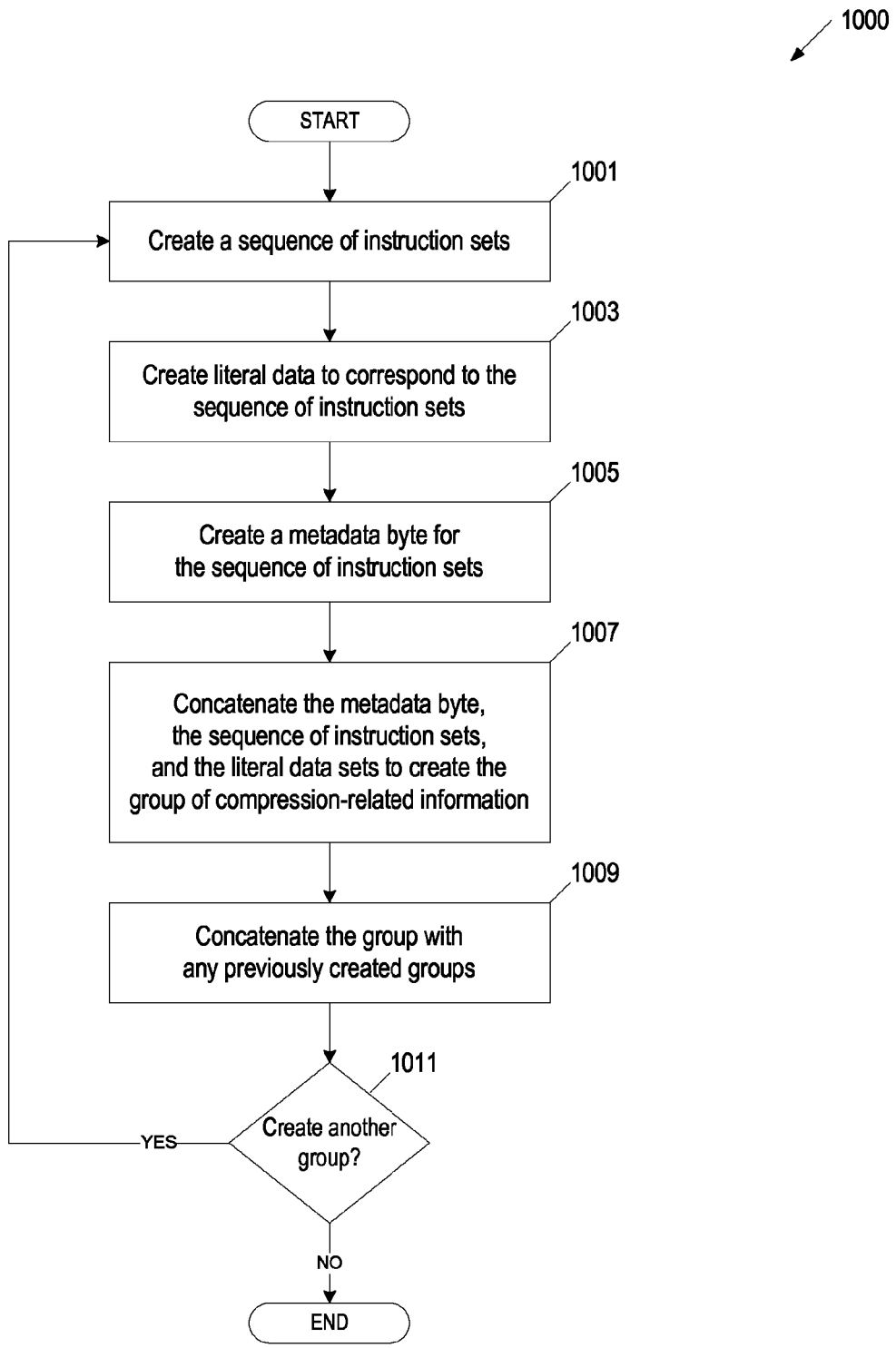
FIG. 10 is a flow diagram of an embodiment of a method for encoding an input stream of data by grouping compression-related information and creating metadata for each group of compression-related information.

FIG. 10 is a flow diagram of an embodiment of a method 1000 for encoding an input stream of data by creating groups of compression-related information. A group of compression-relation information can include a sequence of instructions (e.g., four instruction sets) in each group, literal data corresponding to the sequence of instructions, and metadata for the sequence of instructions for each group. The method 1000 is performed by processing logic that may comprise hardware (circuitry, dedicated logic, etc.), software (such as is run on a general purpose computer system or a dedicated machine), or a combination of both. In one embodiment, the method 1000 is performed by the server machine 115A-N, 117A-N of FIG. 1. The method 1000 may be performed by in-memory compression/decompression system 106 running on server machine 115A-N,117A-N or another machine.

At block 1001, processing logic read a portion of an input data stream and creates a sequence of instructions sets for the corresponding portion. In one embodiment, processing logic sequences four instructions sets together. The sequence of instruction sets can include instructions for literal data that is to be copied and/or instructions for dictionary data that is to be copied. At block 1003, processing logic creates literal data sets that correspond to literal instructions in the sequence of instruction sets. Processing logic can create a literal data set for each literal instruction in the sequence. One embodiment for creating a literal data set is described in greater detail below in conjunction with FIG. 11. At block 1005, processing logic creates a metadata byte that includes information pertaining to the sequence of instruction sets. The metadata byte can describe whether the each of the corresponding sequence of instruction sets is for literal data or copy data, and whether each instruction set has a short length or a long length. The metadata byte can indicate a starting location of the literal data set(s) that corresponds to the literal instructions in the sequence of instruction sets. Processing logic can use predefined type codes to populate the metadata byte. At block 1007, processing logic concatenates the metadata byte, the sequence of instruction sets, and the literal data sets that correspond to the sequence of instruction sets to create a group of compression-related information. The metadata byte can precede (e.g., immediately precede) the sequence of instruction sets. Processing logic can concatenate the one or more literal data sets to follow (e.g., immediately follow) the sequence of instruction sets.

At block 1009, processing logic concatenates the group of compression-related information with the previously created groups, if any, to create a compressed data fragment. Processing logic can concatenate any number of groups of compression-related information to create a compressed data fragment. At block 1011, processing logic determines whether to create another group of compression-related information. Processing logic can determine whether to create another group based on whether there is any other data to be read from an input data stream. If there is more data to be read from the input data stream (block 1011), processing logic returns to block 1001 to read a portion of the input data stream and to create a sequence of instruction sets that corresponds to the portion. If there is no more data to be read from the input data stream (block 1011), the method ends.

Figure 11:
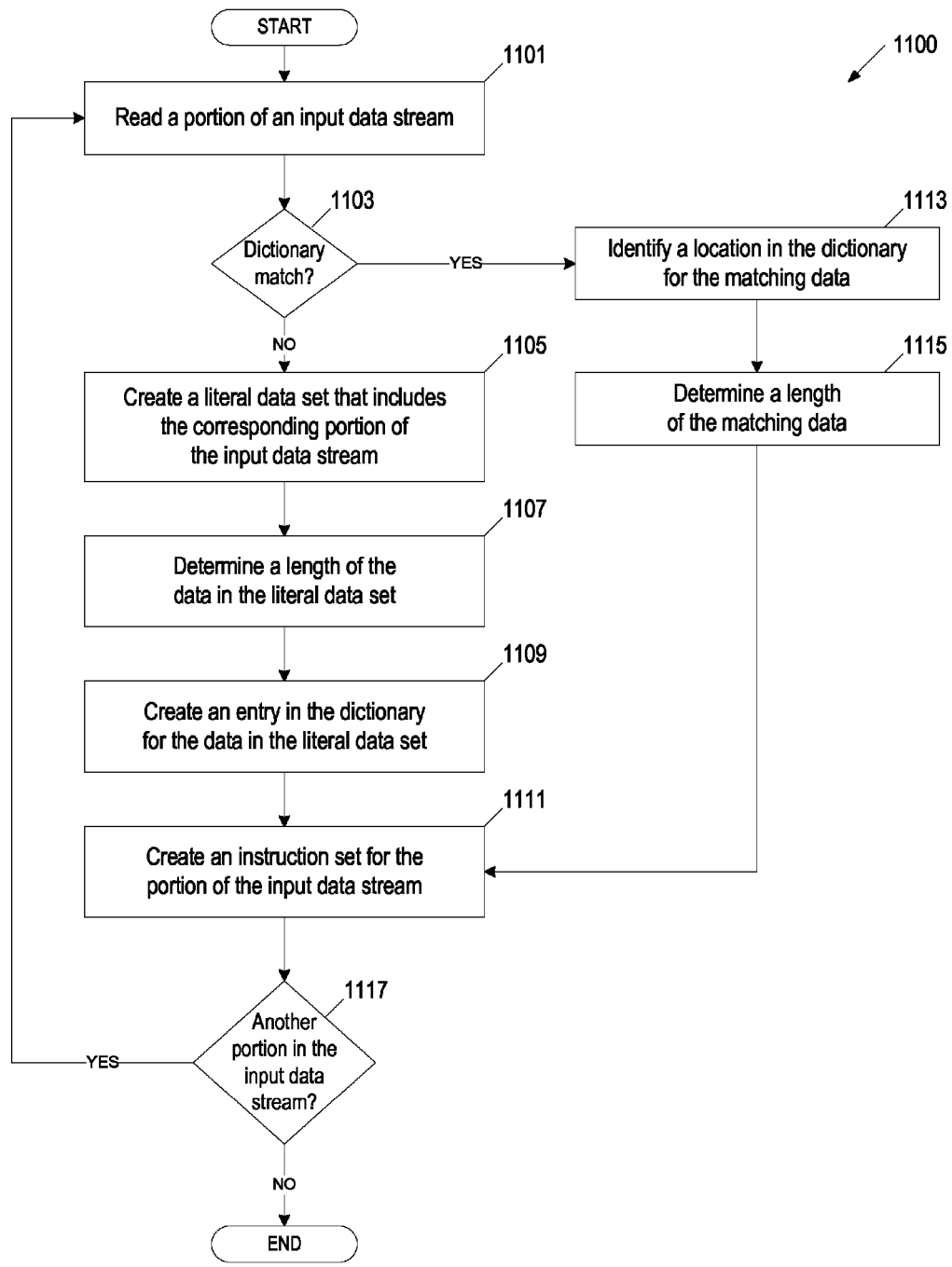
FIG. 11 is a flow diagram of an embodiment of a method for creating instruction sets to decode a compressed data fragment.

FIG. 11 is a flow diagram of an embodiment of a method 1100 for creating instruction sets for decoding a compressed data fragment. The method 1100 is performed by processing logic that may comprise hardware (circuitry, dedicated logic, etc.), software (such as is run on a general purpose computer system or a dedicated machine), or a combination of both. In one embodiment, the method 1100 is performed by the server machine 115A-N,117A-N of FIG. 1. The method 1100 may be performed by in-memory compression/decompression system 106 running on server machine 115A-N,117A-N or another machine.

At block 1101, processing logic reads a portion of an input data stream and determines whether there is matching data in a dictionary at block 1103. When there is a match in the dictionary, processing logic identifies a location in the dictionary for the matching data at block 1113, and determines a length of the matching data in the dictionary at block 1115. At block 1111, processing logic creates an instruction set for the portion of the input data stream that describes the data to be copied. For example, processing logic creates a dictionary instruction set that describes an offset and a length. Depending on the offset of the data to copied, processing logic can create a short dictionary instruction set or a long dictionary instruction set. An instruction set that describes dictionary data that is to be copied can include a first byte that describes the length of the data in the dictionary that is to be copied. The additional bytes in a dictionary instruction set that follow the first byte can describe the offset to use to identify where the data to be copied is located in the dictionary.

When there is not a match in the dictionary (block 1103), processing logic creates a literal data set that includes the corresponding portion of the input data stream at block 1105. At block 1108, processing logic determines a length of the data in the literal data set at block 1107. At block 1109, processing logic creates an entry in the dictionary to represent the data in the literal data set. At block 1111, processing logic creates an instruction set that describes the data to be copied. For example, processing logic may create an instruction set that describes literal data that is to be copied and includes at least one byte that describes a length of the data that is to be copied in the literal data set that corresponds to the literal instruction set. Depending on the length of the data to copied, processing logic can create a short literal instruction set or a long literal instruction set. At block 1117, processing logic determines whether there is another portion of the input data stream to read. If there is another portion to read, processing logic returns to block 1101. If there is not another portion to read, the method 1100 ends.

Figure 12:
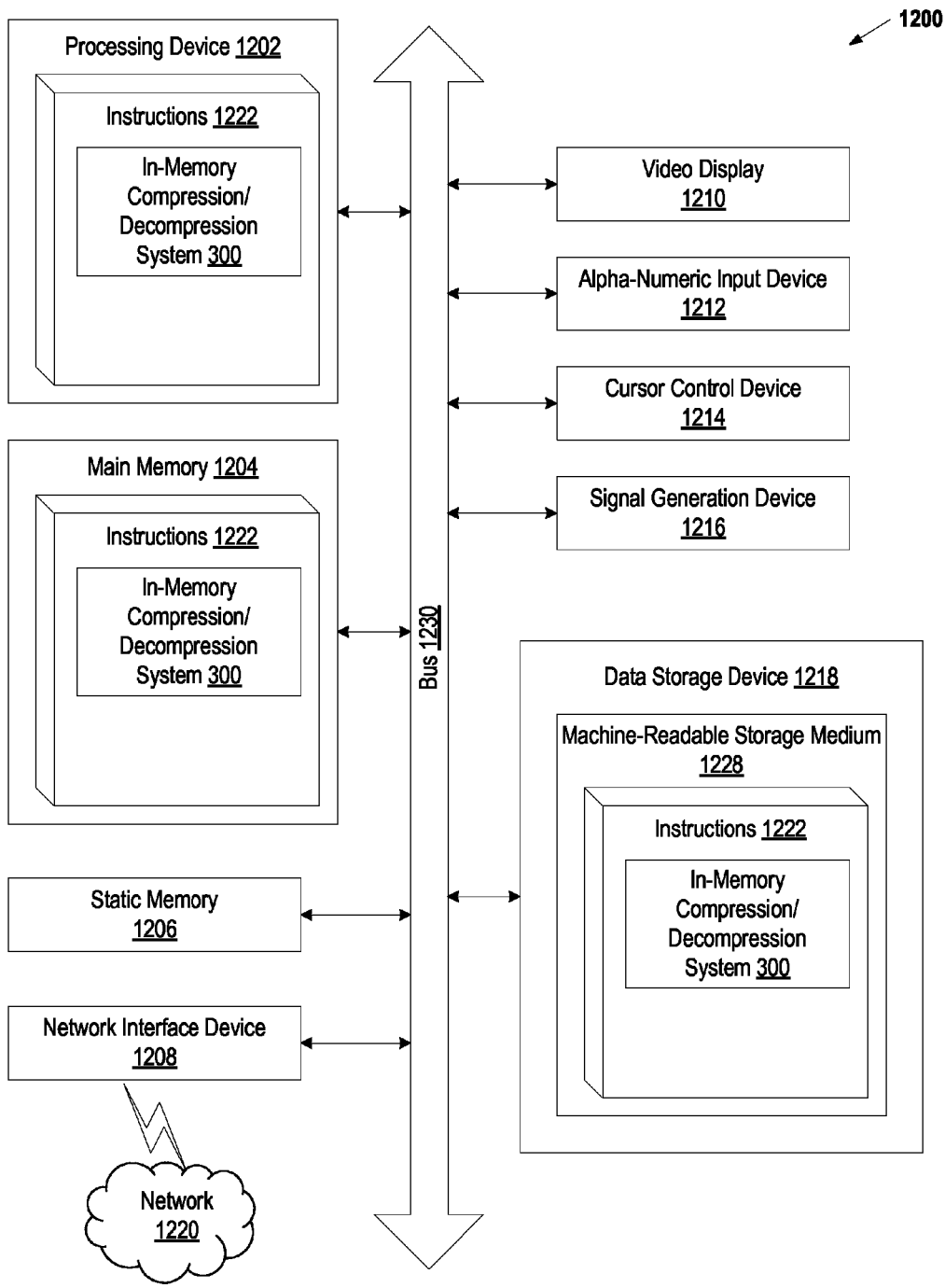
FIG. 12 is a block diagram of an exemplary computer system that may perform one or more of the operations described herein.

FIG. 12 illustrates a diagram of a machine in the exemplary form of a computer system 1200 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 1200 includes a processing device (processor) 1202, a main memory 1204 (e.g., read-only memory (ROM), flash memory, dynamic random access memory (DRAM) such as synchronous DRAM (SDRAM), double data rate (DDR SDRAM), or DRAM (RDRAM), etc.), a static memory 1206 (e.g., flash memory, static random access memory (SRAM), etc.), and a data storage device 1218, which communicate with each other via a bus 730.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 1202 may also be one or more special-purpose processing devices such as an application specific integrated circuit (ASIC), a field programmable gate array (FPGA), a digital signal processor (DSP), network processor, or the like. The processor 1202 is configured to execute instructions 1222 for performing the operations and steps discussed herein.

The computer system 1200 may further include a network interface device 1208. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), and a signal generation device 1216 (e.g., a speaker).

The data storage device 1218 may include a computer-readable storage medium 1228 on which is stored one or more sets of instructions 1222 (e.g., software) embodying any one or more of the methodologies or functions described herein. The instructions 1222 may also reside, completely or at least partially, within the main memory 1204 and/or within the processor 1202 during execution thereof by the computer system 1200, the main memory 1204 and the processor 1202 also constituting computer-readable storage media. The instructions 1222 may further be transmitted or received over a network 1220 via the network interface device 1208.

In one embodiment, the instructions 1222 include instructions for an in-memory compression/decompression system (e.g., in-memory compression/decompression system 300 of FIG. 3) and/or a software library containing methods that call in-memory compression/decompression system. While the computer-readable storage medium 1228 (machine-readable storage medium) is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present invention. The term "computer-readable storage medium" shall accordingly be taken to include, but not be limited to, solid-state memories, optical media, and magnetic media.

In the foregoing description, numerous details are set forth. It will be apparent, however, to one of ordinary skill in the art having the benefit of this disclosure, that the present invention may be practiced without these specific details. In some instances, well-known structures and devices are shown in block diagram form, rather than in detail, in order to avoid obscuring the present invention.

Some portions of the detailed description have been presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "computing", "comparing", "applying", "creating", "ranking," "classifying," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

For simplicity of explanation, the methods are depicted and described herein as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

Certain embodiments of the present invention also relate to an apparatus for performing the operations herein. This apparatus may be constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   reading, by a computing device, a metadata byte in a compressed data fragment, wherein the metadata byte comprises information pertaining to a sequence of instruction sets to decode data in the compressed data fragment, the sequence of instruction sets following the metadata byte, and one or more literal data sets corresponding to the sequence of instruction sets and following the sequence of instruction sets in the compressed data fragment;

determining a location of the one or more literal data sets in the compressed data fragment using the metadata byte prior to reading the sequence of instruction sets;

determining a length of each of the one or more literal data sets based on the sequence of instruction sets; and copying the one or more literal data sets to an in-memory data store, as a batch job for the sequence of instruction sets, based on the location and a corresponding length.

2. The method of claim 1, further comprising:

determining a length of at least one set of dictionary data to be copied from the sequence of instruction sets; and copying the at least one set of dictionary data to the in-memory data store as part of the batch job using the corresponding length.

3. The method of claim 1, wherein the sequence of instruction sets comprises four instruction bytes.

4. The method of claim 1, wherein a metadata byte comprises:

one bit for each of the sequence of instruction sets to indicate whether a corresponding instruction sets pertains to literal data or dictionary data and one bit for each of the sequence of instruction sets to indicate whether a corresponding instruction sets pertains to short data or long data.

5. The method of claim 4, wherein short data for literal data is one byte and long data for literal data is two bytes, and short data for dictionary data is two bytes and long data for dictionary data is three bytes.

6. The method of claim 1, wherein an instruction set comprises:

at least one of no more than two bytes describing a length of a corresponding literal data set or no more than two bytes describing an offset in a dictionary and one byte describing a length of dictionary data to be copied.

7. The method of claim 1, wherein determining the location of the one or more literal data sets comprises:

determining a number of populated bits in the metadata byte; and determining a sum of the number of populated bits added to four, wherein the sum represents a number of bytes following the metadata byte and immediately preceding the location of the one or more literal data sets.

8. The method of claim 1, wherein determining the location of the one or more literal data sets comprises:

creating mapping data that correlates available values for the metadata byte to a number of bytes; and locating an available value in the mapping data that matches an actual value of the metadata byte, wherein the number of bytes that corresponds to the matching available value represents a number of bytes following the metadata byte corresponding to the location of the one or more literal data sets.

9. A method comprising:

creating, by a computing device, a metadata byte comprising information pertaining to a sequence of instruction sets to decode data in a compressed data fragment, wherein the metadata byte provides a starting location of one or more literal data set that correspond to at least one of the sequence of instruction sets;

concatenating the sequence of instruction sets with the metadata byte, wherein at least one of the instruction sets comprises at least one byte describing a length of the literal data that corresponds to the at least one instruction set, wherein the metadata byte is followed by the sequence of instruction sets; and concatenating the one or more literal data sets with the concatenation of the sequence of instruction sets and the metadata byte, wherein the sequence of instruction sets is followed by the one or more literal data sets corresponding to the sequence of instruction sets.

10. A system comprising:

a memory; and a processing device coupled with the memory and configured to read a metadata byte in a compressed data fragment, wherein the metadata byte comprises information pertaining to a sequence of instruction sets to decode data in the compressed data fragment, the sequence of instruction sets following the metadata byte, and one or more literal data sets corresponding to the sequence of instruction sets and following the sequence of instruction sets;

determine a location of the one or more literal data sets in the compressed data fragment using the metadata byte prior to reading the sequence of instruction sets;

determine a length of each of the one or more literal data sets based on the sequence of instruction sets; and copy the one or more literal data sets to an in-memory data store, as a batch job for the sequence of instruction sets, based on the location and a corresponding length.

11. The system of claim 10, wherein the processing device is further to:

determine a length of at least one set of dictionary data to be copied from the sequence of instruction sets; and copy the at least one set of dictionary data to the in-memory data store as part of the batch job using the corresponding length.

12. The system of claim 10, wherein the sequence of instruction sets comprises four instruction bytes.

13. The system of claim 10, wherein a metadata byte comprises:

one bit for each of the sequence of instruction sets to indicate whether a corresponding instruction sets pertains to literal data or dictionary data and one bit for each of the sequence of instruction sets to indicate whether a corresponding instruction sets pertains to short data or long data.

14. The system of claim 13, wherein short data for literal data is one byte and long data for literal data is two bytes, and short data for dictionary data is two bytes and long data for dictionary data is three bytes.

15. The system of claim 10, wherein an instruction set comprises:

at least one of no more than two bytes describing a length of a corresponding literal data set or no more than two bytes describing an offset in a dictionary and one byte describing a length of dictionary data to be copied.

16. The system of claim 10, wherein to determine the location of the one or more literal data sets comprises:

determining a number of populated bits in the metadata byte; and determining a sum of the number of populated bits added to four, wherein the sum represents a number of bytes following the metadata byte and immediately preceding the location of the one or more literal data sets.

17. The system of claim 10, wherein to determine the location of the one or more literal data sets comprises:

creating mapping data that correlates available values for the metadata byte to a number of bytes; and locating an available value in the mapping data that matches an actual value of the metadata byte, wherein the number of bytes that corresponds to the matching available value represents a number of bytes following the metadata byte corresponding to the location of the one or more literal data sets.

18. A non-transitory computer readable storage medium encoding instructions thereon that, in response to execution by a computer device, cause the computing device to perform operations comprising:

reading, by the computing device, a metadata byte in a compressed data fragment, wherein the metadata byte comprises information pertaining to a sequence of instruction sets to decode data in the compressed data fragment, the sequence of instruction sets following the metadata byte, and one or more literal data sets corresponding to the sequence of instruction sets and following the sequence of instruction sets in the compressed data fragment;

determining a location of the one or more literal data sets in the compressed data fragment using the metadata byte prior to reading the sequence of instruction sets;

determining a length of each of the one or more literal data sets based on the sequence of instruction sets; and copying the one or more literal data sets to an in-memory data store, as a batch job for the sequence of instruction sets, based on the location and a corresponding length.

19. The non-transitory computer readable storage medium of claim 18, further comprising:

determining a length of at least one set of dictionary data to be copied from the sequence of instruction sets; and copying the at least one set of dictionary data to the in-memory data store as part of the batch job using the corresponding length.

20. The non-transitory computer readable storage medium of claim 18, wherein the sequence of instruction sets comprises four instruction bytes.

21. The non-transitory computer readable storage medium of claim 18, wherein a metadata byte comprises:

one bit for each of the sequence of instruction sets to indicate whether a corresponding instruction sets pertains to literal data or dictionary data and one bit for each of the sequence of instruction sets to indicate whether a corresponding instruction sets pertains to short data or long data.

22. The non-transitory computer readable storage medium of claim 21, wherein short data for literal data is one byte and long data for literal data is two bytes, and short data for dictionary data is two bytes and long data for dictionary data is three bytes.

23. The non-transitory computer readable storage medium of claim 18, wherein an instruction set comprises:

at least one of no more than two bytes describing a length of a corresponding literal data set or no more than two bytes describing an offset in a dictionary and one byte describing a length of dictionary data to be copied.

24. The non-transitory computer readable storage medium of claim 18, wherein determining the location of the one or more literal data sets comprises:

determining a number of populated bits in the metadata byte; and determining a sum of the number of populated bits added to four, wherein the sum represents a number of bytes following the metadata byte and immediately preceding the location of the one or more literal data sets.

25. The non-transitory computer readable storage medium of claim 18, wherein determining the location of the one or more literal data sets comprises:

creating mapping data that correlates available values for the metadata byte to a number of bytes; and locating an available value in the mapping data that matches an actual value of the metadata byte, wherein the number of bytes that corresponds to the matching available value represents a number of bytes following the metadata byte corresponding to the location of the one or more literal data sets.

* * * * *